US006844584B2

(12) United States Patent
Palm et al.

(10) Patent No.: US 6,844,584 B2
(45) Date of Patent: Jan. 18, 2005

(54) MEMORY CELL, MEMORY CELL CONFIGURATION AND FABRICATION METHOD

(75) Inventors: Herbert Palm, Hoehenkirchen (DE); Josef Willer, Riemerling (DE); Achim Gratz, Steinbach-Hallenberg (DE); Jakob Kriz, Dresden (DE); Mayk Roehrich, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/927,573

(22) Filed: Aug. 9, 2001

(65) Prior Publication Data
US 2003/0015752 A1 Jan. 23, 2003

Related U.S. Application Data

(63) Continuation-in-part of application No. 09/900,654, filed on Jul. 6, 2001, now abandoned.

(30) Foreign Application Priority Data

Aug. 11, 2000 (DE) ......................... 100 39 441

(51) Int. Cl.⁷ ............................................. H01L 21/336
(52) U.S. Cl. .................. 257/315; 257/314; 257/316; 365/185.01; 365/185.14
(58) Field of Search ................................ 257/314–316, 257/390, E21.677, E21.679, E21.693, E27.102, E27.103; 365/185.01, 185.14, 185.24–185.33, 181.01, 181.14, 181.24, 181.33

(56) References Cited

U.S. PATENT DOCUMENTS

| 3,731,163 A | 5/1973 | Shuskus |
| 4,360,900 A | * 11/1982 | Bate ........................... 365/184 |
| 5,768,192 A | 6/1998 | Eitan |
| 5,905,285 A | 5/1999 | Gardner et al. |
| 5,966,603 A | 10/1999 | Eitan |
| 5,973,358 A | 10/1999 | Kishi |
| 6,001,742 A | * 12/1999 | Chang ......................... 438/706 |
| 6,011,725 A | 1/2000 | Eitan |
| 6,191,459 B1 | 2/2001 | Hofmann et al. |
| 6,323,525 B1 | * 11/2001 | Noguchi et al. ............ 257/385 |

FOREIGN PATENT DOCUMENTS

| DE | 29 46 864 A1 | 6/1980 |
| DE | 195 45 903 A1 | 6/1997 |
| DE | 196 00 423 A1 | 7/1997 |
| DE | 196 00 422 C1 | 8/1997 |
| EP | 0 967 654 A1 | 12/1999 |
| JP | 04 012 573 | 1/1992 |
| RU | 752476 | 7/1980 |
| TW | 84 113 408 | 7/1997 |

OTHER PUBLICATIONS

International Publication No. WO 99/60631 (Eitan et al.), dated Nov. 25, 1999.
"A Sub–0.1–μm Grooved Gate MOSFET with High Immunity to Short–Channel Effects" (Tanaka et al.), IEDM 93, Chapter 21.1.1, pp. 537–540.
"A Flash EEPROM Cell with Self–Aligned Trench Transistor & Isolation Structure" (Nakagawa et al.), 2000 Symposium on VLSI Technology Digest of Technical Papers.

* cited by examiner

Primary Examiner—Minhloan Tran
Assistant Examiner—Thomas L Dickey
(74) Attorney, Agent, or Firm—Laurence A. Greenberg; Werner H. Stemer; Ralph E. Locher

(57) ABSTRACT

Each memory cell is a memory transistor which is provided on a top side of a semiconductor body and has a gate electrode which is arranged in a trench located between a source region and a drain region that are formed in the semiconductor material. The gate electrode is separated from the semiconductor material by a dielectric material. At least between the source region and the gate electrode and between the drain region and the gate electrode, there is an oxide-nitride-oxide layer sequence. The layer sequence is provided for the purpose of trapping charge carriers at the source and the drain.

17 Claims, 7 Drawing Sheets

MEMORY CELL, MEMORY CELL CONFIGURATION AND FABRICATION METHOD

CROSS-REFERENCE TO RELATED APPLICATION

This application is a continuation-in-part of application Ser. No. 09/900,654, filed Jul. 6, 2001, now abandoned.

BACKGROUND OF THE INVENTION

Field of the Invention

The invention relates to the field of electrically writable and erasable non-volatile flash memories. It describes a non-volatile memory cell which is constructed in accordance with the SONOS principle (semiconductor-oxide-nitride-oxide-semiconductor) and can be used in a virtual-ground-NOR architecture.

Extremely small non-volatile memory cells are required for very large scale integration densities for multimedia applications. Ongoing development in semiconductor technology allows increasingly large storage capacities, which will very soon reach the gigabit range. However, while the minimum feature size, which is determined by lithography, continues to decrease, other parameters, such as for example the thickness of the tunnel oxide, can no longer be scaled accordingly. The associated reduction in the channel length in planar transistors with smaller features requires an increase in the channel doping, in order to avoid the occurrence of a punch-through between source and drain. This leads to an increase in the threshold voltage, which is usually compensated for by a reduction in the thickness of the gate oxide.

However, planar SOSNOS memory cells which can be programmed by channel-hot-electrons and can be erased using hot holes (cf. U.S. Pat. No. 5,768,192, U.S. Pat. No. 6,011,725, International Publication WO 99/60631) require a control dielectric with a thickness which is equivalent to a gate oxide. However, this thickness cannot be reduced as desired without the number of programming cycles which can be executed (the endurance of the memory cell) falling unacceptably. Therefore, a sufficiently great channel length to ensure that the dopant concentration in the channel does not have to be selected to be excessively high is required, since otherwise the threshold voltage rises too greatly.

The publication by J. Tanaka et al.: "A Sub-0.1-$\mu$m Grooved Gate MOSFET with High Immunity to Short-Channel Effects" in IEDM 93, pp. 537–540 (1993) describes a transistor on a p$^+$ substrate, in which the gate electrode is arranged in a trench between the n$^+$-source region and the n$^+$-drain region, so that in this way a curved channel region is formed in the substrate.

The publication by K. Nakagawa et al.: "A Flash EEPROM Cell with Self-Aligned Trench Transistor & Isolation Structure" in 2000 IEEE Symposium on VLSI Technology Digest of Technical Papers describes a transistor as a memory cell with a floating-gate electrode, which is arranged between the n$^+$-source region and the n$^+$-drain region, extending into a p-well of the substrate. Between the floating-gate electrode and the control-gate electrode there is a dielectric layer of an oxide-nitride-oxide layer sequence.

Published German Patent Application DE 195 45 903 A1 describes a read-only memory cell configuration, in which planar MOS transistors are arranged in parallel cells. Adjacent cells run alternately at the base of longitudinal trenches and between adjacent longitudinal trenches. The bit lines run transversely and the word lines parallel to the longitudinal trenches.

Published German Patent Application DE 196 00 422 C1 describes an electrically programmable memory cell configuration in which there is a multiplicity of individual memory cells which each include an MOS transistor with a gate dielectric with traps and which are arranged in parallel rows. Adjacent rows in each case run alternately at the base of longitudinal trenches and between adjacent longitudinal trenches and are isolated from one another.

German Patent DE 196 03 810 C1 describes a memory cell configuration which includes first memory cells with planar MOS transistors and second memory cells with vertical MOS transistors. The planar MOS transistors are in this case arranged at the base of and on the crown of parallel trenches which are in strip form. The vertical MOS transistors are arranged on the side walls of the trenches.

SUMMARY OF THE INVENTION

It is accordingly an object of the invention to provide a memory cell for a memory cell configuration and a method for producing the memory cell which overcomes the above-mentioned disadvantageous of the prior art apparatus and methods of this general type. In particular, it is an object of the invention to provide a memory cell for such a memory cell configuration which requires very little surface area and to provide an associated fabrication method.

With the foregoing and other objects in view there is provided, in accordance with the invention, a memory cell having a memory transistor which is provided on the top side of a semiconductor body or of a semiconductor layer with a gate electrode arranged between a source region and a drain region which are formed in the semiconductor material. The gate electrode is separated from the semiconductor material by dielectric material. At least between the source region and the gate electrode and between the drain region and the gate electrode there is a layer sequence which includes a memory layer, which is intended to trap charge carriers at source and drain, between boundary layers. The material of the boundary layers has a higher energy band gap than the material of the memory layer, so that the charge carriers which are trapped in the memory layer between the boundary layers remain located in that area.

A suitable material for the memory layer is preferably a nitride; an oxide is primarily suitable as surrounding material. In the case of a memory cell in the silicon material system, the memory layer is in this example silicon nitride with an energy band gap of approximately 5 eV, while the surrounding boundary layers are silicon oxide with an energy band gap of approximately 9 eV. The memory layer may be a different material with a smaller energy band gap than that of the boundary layers, the intention being that the difference between the energy band gaps should be as great as possible, for good electrical confinement of the charge carriers. Traps or trapping centers are preferably provided in the memory layer and form energy levels within the energy band gap of the memory layer which are to be occupied by charge carriers.

The lower boundary layer, which faces the semiconductor material, is to be so thick that direct tunneling of the charge carriers is avoided. When using $SiO_2$, the lower boundary layer is therefore preferably at least approximately 6 nm to 7 nm thick. The upper boundary layer, which faces the gate electrode, is preferably typically about twice as thick as the lower boundary layer, in order to avoid direct tunneling and Fowler-Nordheim tunneling out of the gate during the erasing operation.

The layer sequence including the memory layer and the boundary layers is preferably formed with a low oxide-equivalent thickness, which is intended to mean the thickness of a pure oxide layer as dielectric for forming the same capacitance. For this purpose, the materials of the layers are selected in such a way that a mean relative dielectric constant of the layer sequence is more than 4. This is preferably achieved by the fact that the material of the lower boundary layer which faces the semiconductor material is formed with a relative dielectric constant of at least 3.9, corresponding to that of $SiO_2$. It is even better if the relative dielectric constant is selected to be higher, at least approximately 7.8, since in this way improved gate control is achieved and more rapid programming is possible. This is because this reduces the electrically active thickness of the gate dielectric, and a thinner lower boundary layer allows higher programming rates and/or lower programming voltages.

In this context, it is necessary to take into account the fact that the barrier level between the semiconductor material and the memory layer must remain sufficiently high. This barrier level generally decreases as the relative dielectric constant of the material of the lower boundary layer increases. In the case of $SiO_2$ on Si, the barrier level is approximately 3.1 eV; this is the distance of the Fermi level of the electrons in the silicon from the lower edge of the conduction band in the $SiO_2$ layer. This barrier level should not fall below 2 eV. Conversely, a low barrier level is advantageous, since the programming rate in this case increases drastically and opens up the possibility of reducing the source/drain voltage and therefore of reducing the risk of a punch-through in the channel. If demands allow, therefore, the material of the lower boundary level may advantageously also have a relative dielectric constant of at least 20.

Since the interface between silicon and silicon dioxide is well controlled, a lower boundary layer of $SiO_2$ is advantageous. By way of example, tantalum oxide, hafnium silicate, titanium oxide ($TiO_2$ in the case of a stoichiometric composition), titanate, tantalum oxide ($Ta_2O_5$ in the case of a stoichiometric composition), tantalate, zirconium oxide ($ZrO_2$ in the case of a stoichiometric composition), aluminum oxide ($Al_2O_3$ in the case of a stoichiometric composition) or intrinsically conductive (undoped) silicon can be used as material for the memory layer in combination with silicon oxide. Silicon nitride has a relative dielectric constant of about 7.9. The use of an alternative material with a higher dielectric constant (e.g.=15 . . . 18) allows the oxide-equivalent total thickness of the layer stack provided for the storage to be reduced and is therefore advantageous. On the other hand, silicon nitride can also be used to good effect as the lower boundary layer. In this case, silicon oxynitride may also be used instead of a pure silicon nitride; in this case, the oxygen and nitrogen levels may be varied continuously or in steps from the semiconductor material toward the memory layer.

The listed materials tantalum oxide, hafnium silicate, titanium oxide, zirconium oxide and aluminum oxide, but also tantalum oxide ($Ta_2O_5$ for a stoichiometric composition), titanate and tantalate are also suitable as materials for the boundary layers. The use of silicates in the boundary layers should be particularly emphasized. By way of example, hafnium silicate, in this case preferably without traps, may be used to good effect. In this way, it is also possible to achieve a continuously varying composition of the lower boundary layer, in which, in order to achieve a good interface with the silicon of the substrate or semiconductor body, $SiO_2$ is present at the bottom, and toward the top, i.e. toward the memory layer, this material is increasingly mixed with hafnium, so that if appropriate a stoichiometric composition of a hafnium silicate is reached. Toward the memory layer, the silicon content of the material may decrease, until ultimately only $HfO_2$ is present adjacent to the memory layer. The result is a barrier level between the semiconductor material and the memory layer which is reduced from 3.1 eV, when exclusively $SiO_2$ is used, to approximately 2 eV. A corresponding continuous variation of the composition of a lower boundary layer based on $SiO_2$ is also possible with other chemical elements instead of hafnium, preferably with metals, as additives, for example with titanium, zirconium or lanthanum. As well as silicates, $Al_2O_3$ and $Ta_2O_5$ are of particular interest for the upper boundary layer, a combination with titanate, titanium dioxide, tantalate or tantalum pentoxide being preferably suitable in the memory layer.

The layer sequence including a boundary layer, a memory layer and a further boundary layer may be applied to the entire surface of a top side of the semiconductor body, so that sections of the memory layer are also present on the regions of this surface which are horizontal with respect to this top side and on the bases of the trenches which are filled with the gate electrodes. Alternatively, the memory layer may be delimited as a result of the layer sequence including the memory layer in each case being present on the walls of a trench which is present in the semiconductor material and in which respective gate electrodes are arranged and being interrupted between these walls.

The memory cells may be connected as a memory cell configuration in a virtual-ground-NOR architecture, it being possible to achieve a channel length which can be selected freely within wide limits. This is achieved by forming trenches in a semiconductor body. The trenches may be etched, for example, in an $n^+$ region which has already been produced, so that the channel regions at the base of these trenches have a curvature directed toward the semiconductor body or are guided more deeply with respect to the source and drain regions. The advantages of this configuration lie in particular in the possibility of in this way taking up the smallest possible area at the level of the top side of the semiconductor body (crosspoint cell), the area contracting with the fineness of pattern which can be achieved by lithography (relates to the shrinkability criterion). Moreover, the channel length of the memory transistors can be optimized by means of the depth of the trenches and the shape of the trench bases. Low threshold voltages of less than 1 V and higher source-drain voltages are possible than with planar transistors of the same scale (design rule).

Other features which are considered as characteristic for the invention are set forth in the appended claims.

Although the invention is illustrated and described herein as embodied in a memory cell, memory cell configuration and fabrication method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
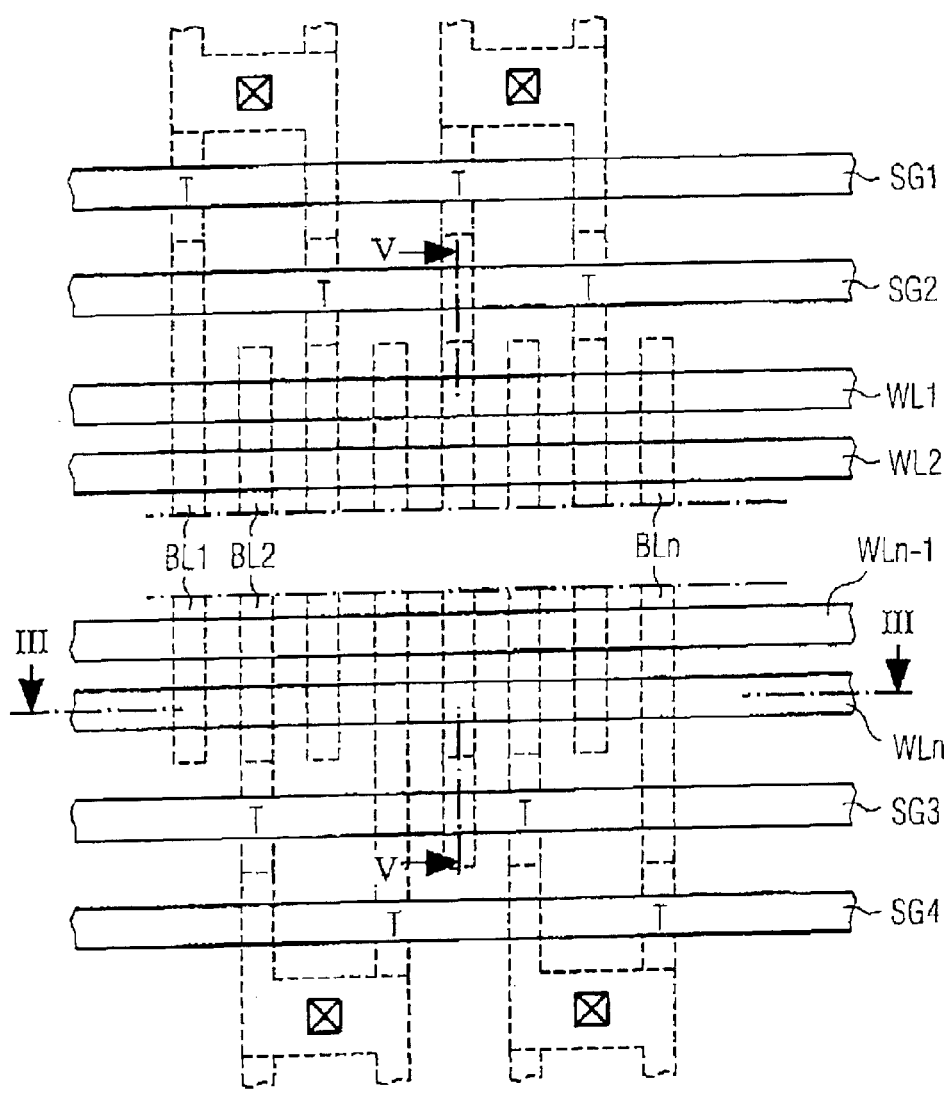
FIG. 1 shows a plan view of a memory cell configuration.

Referring now to the figures of the drawing in detail and first, particularly, to FIG. 1 thereof, there is shown a diagrammatic plan view of a typical layout for a configuration of memory cells that form a memory. A layer sequence is provided as a memory and this layer sequence is located above the region that is taken up by the buried bit lines BL1, BL2, ..., BLn and the word lines WL1, WL2, ..., WLn. The layer sequence is located closer to the surface of the chip than the bit lines Bli and the word lines Wli. In the examples described below, in order to simplify the description, the layer sequence is assumed to be an oxide-nitride-oxide layer sequence or ONO layer sequence. This ONO layer sequence may be interrupted between the bit lines and the word lines or may be present over the entire surface. Drive components are provided at the periphery of the memory and the drive components preferably include circuit logic, designed using CMOS technology, for addressing the memory. To select the bit lines which lead to the source regions and to the drain regions of the individual memory cells, in this example, there are provided select transistors T. The gate electrodes of the select transistors T, for example, for binary addressing, are connected in blocks to select gate lines SG1, SG2, ..., SGn. A memory architecture of this type is known per se.

Figure 2:
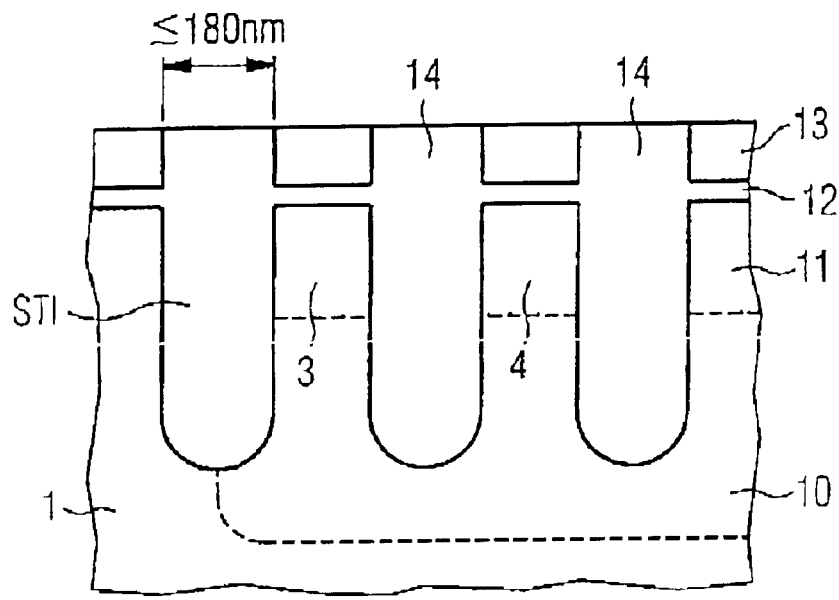
FIGS. 2 and 3 show the cross section marked in FIG. 1 after various steps of fabrication.

A cross section through an excerpt of a first intermediate product of a preferred fabrication method for an example of the memory is illustrated in FIG. 2. The fabrication preferably takes place as part of a CMOS process that is also used to produce the drive electronics. In this context, it is customary for the top side of a semiconductor body or of a semiconductor layer which has been grown on a substrate to initially be covered with a pad oxide 12 and a pad nitride 13. Using a suitable mask technique, trenches 14 which are provided for the memory and an STI isolation (shallow trench isolation), are etched out, preferably at a minimum width (distance between a source region and a drain region of the same memory cell) of at most 180 nm and are filled with a dielectric material, e.g. an oxide. P-wells and n-wells are formed using a CMOS process which is known per se by implantation of dopant in the semiconductor material. A p-well 10 is preferably fabricated in the region of the memory. A triple well with three regions embedded in each other, in which the signs of electrical conductivity alternate, is fabricated for those transistors via which the word lines of the memory are to be connected to a negative potential. This is done to be able to erase memory cells using the hot holes (HH) method with a negative gate potential. The bit lines containing the source regions 3 and the drain regions 4 of the individual memory transistors are fabricated by further implantation 11, in this example, for n-type conduction. The drain region 4 in each case functions as a source region for the transistor which adjoins it in series. The abovementioned programming method using channel-hot-electrons (CHE) allows any memory cell to store one information bit both via the source region and via the drain region, for which purpose, during programming, the roles of source and drain are exchanged in the fundamentally symmetrical structure of the transistors.

The CHE programming and HH erasing require a hard transition between the conductivities of the source or drain and the well. Therefore, dopant for electrical conduction of the opposite sign (in this example $p^+$-type conduction) is introduced, preferably together with the implantation of the dopants for the source and the drain (in this example for $n^+$-type conduction), in higher concentrations through deeper implantation into the layer section of the well (in this example $p^-$-doped) which adjoins the source or drain.

The trenches 14 which are provided for the gate electrodes of the memory transistors are etched clear, then the pad nitride 13 and the pad oxide 12 are removed, and the ONO layer sequence is applied to the entire surface. The ONO layer sequence is preferably a lower boundary layer 5 including an oxide which is approximately 2.5 to 8 nm thick (bottom oxide, preferably thermally produced), a memory layer 6 including a nitride which is approximately 1 to 5 nm thick (preferably deposited by means of LPCVD [low-pressure chemical vapor deposition]), and an upper boundary layer 7 including an oxide which is approximately 3 to 12 nm thick (top oxide, deposited). The trenches are filled with electrically conductive material, preferably with conductively doped polysilicon which is applied to the entire surface, in order to fabricate the gate electrodes 2 and the layer for the conductor tracks 8 which form the word lines WL. A layer 9 which reduces the feed resistance, for example of tungsten silicide or a metal layer of tungsten, is also fabricated.

Figure 3:
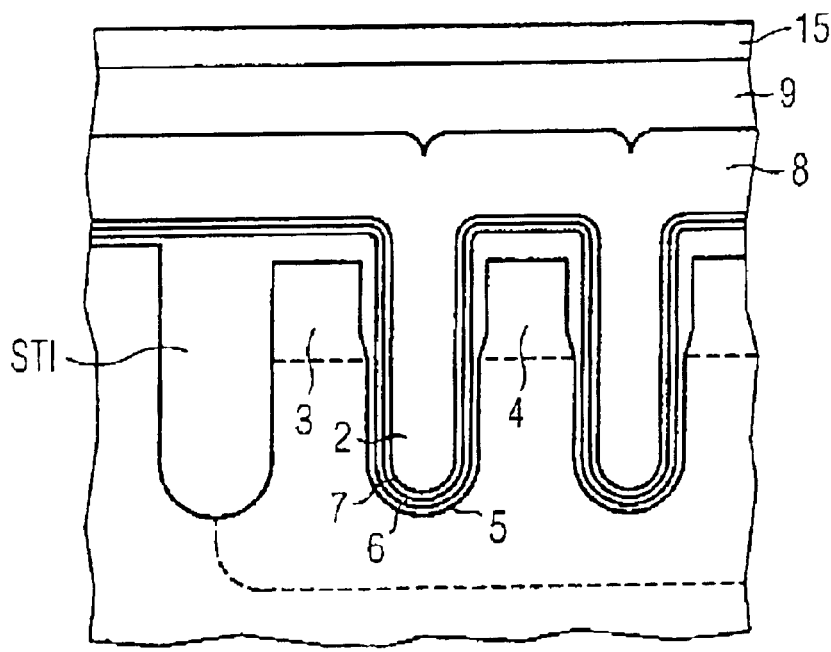

FIG. 3 shows part of the cross section through the memory cell configuration which is marked in FIG. 1, and also shows a mask layer 15. The mask layer 15, for example, is a hard mask of nitride, which has been patterned in strip form and is used to pattern the gate electrodes and the word lines, as a result of the polysilicon which is not covered by the mask being removed, for example by means of RIE (reactive ion etching).

Figure 4:
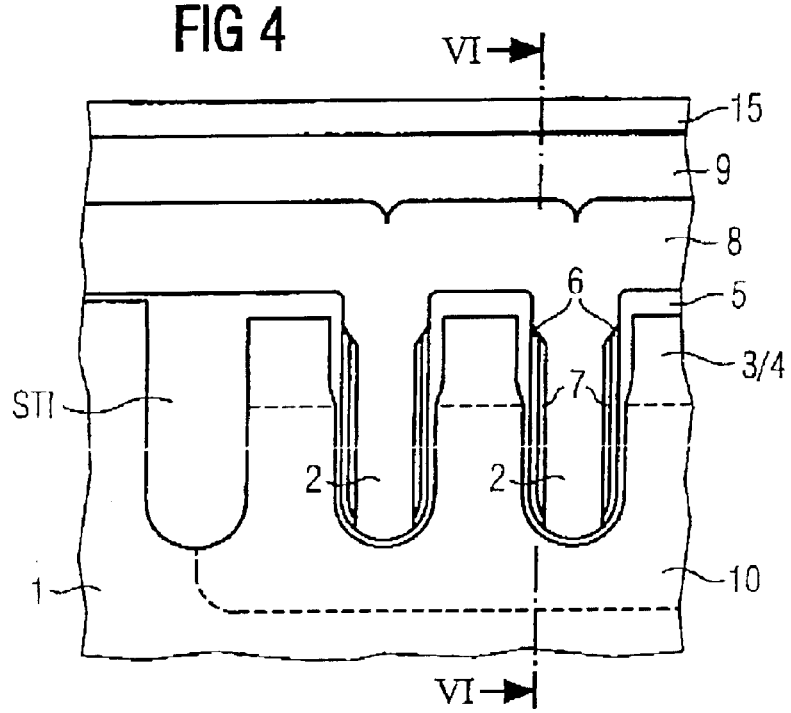
FIG. 4 shows an alternative configuration, in a cross section corresponding to that shown in FIG. 3.

FIG. 4 illustrates an alternate configuration, in which, before the polysilicon layer is applied, the ONO layer sequence has been anisotropically etched away down to the lower boundary layer. Therefore, residues of the ONO layer sequence remain only in those regions on the walls of the trenches which are intended to store captured charge carriers. Otherwise, this exemplary embodiment is identical to the exemplary embodiment shown in FIG. 3.

Figure 5:
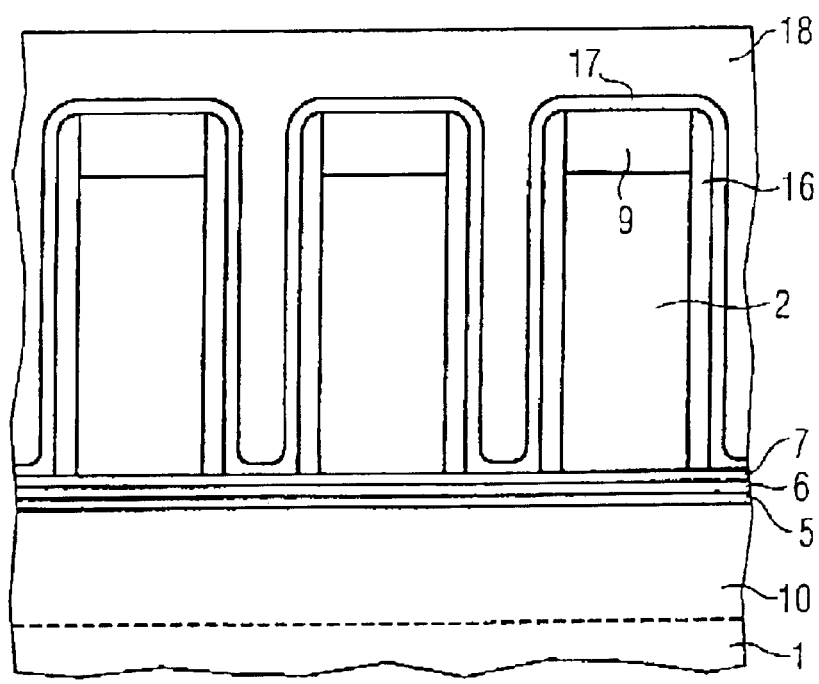
FIGS. 5 and 6 show the embodiments shown in FIGS. 3 and 4 in the cross sections marked in FIGS. 1 and 4.

FIG. 5 illustrates part of a cross section through the memory cell configuration which runs transversely to the word lines. The embodiment corresponds to the design shown in FIG. 3, with an ONO layer sequence which is present over the entire surface. After the word lines have been patterned in strip form, during which process the ONO layer sequence between the word lines can be at least partially located apart from the lower boundary layer 5, or even completely removed down to the semiconductor material, spacers 16 are fabricated. Fabrication of the spacers 16 is an operation which forms part of the fabrication process of the CMOS drive periphery. If the ONO layer sequence which is illustrated by solid lines in FIG. 5 has been removed between the word lines, the spacers 16 accordingly extend as far as the boundary layer 5 or the semiconductor material. A nitride layer 17 on the entire surface is covered by a planarizing layer 18, with which the remaining parts of the trenches 14 between the word lines are filled. Before the planarization layer 18 is applied, it is also possible for $p^+$ implantation to take place between the word lines, enabling the insulation between the individual memory cells to be improved.

Figure 6:
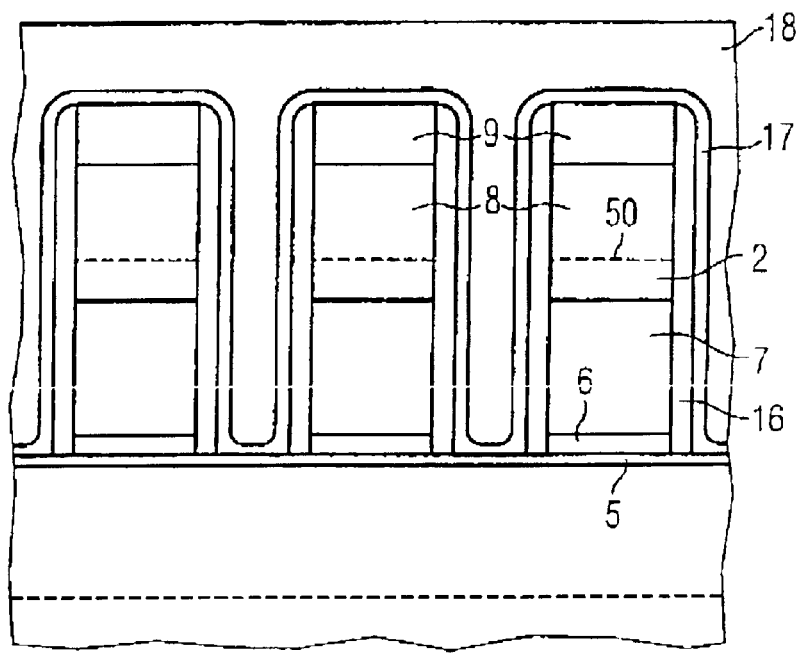

FIG. 6 shows a section through the embodiment illustrated in FIG. 4, taken in the same direction as in FIG. 5. In the direction of the view given in FIG. 4, the upper interface of the lower boundary layer 5 across the source/drain region 3/4 is indicated with a dashed line 50, as a hidden contour. Above those sections of the ONO layer sequence which have remained as spacer-like residues, there is a section of the gate electrode 2. The lower boundary layer 5 is present over the entire surface. The memory layer 6 and the upper boundary layer 7 are only present on the side walls of the trenches between the gate electrode and the source/drain regions. The boundary between the drawn-in sectional surfaces of these layers is dependent on the precise position of the cross section and on the inclination of the trench walls and the uniformity of the thickness of the layers. The illustration in FIG. 6 is only intended to explain the basic structure, which otherwise corresponds to the structure shown in FIG. 5.

Figure 7:
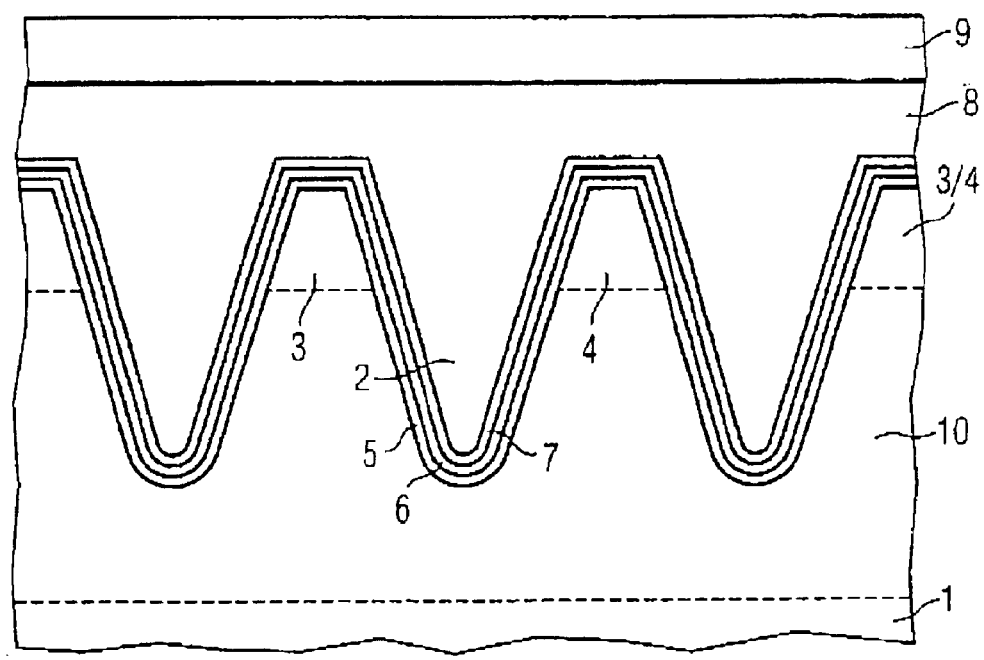
FIG. 7 shows a further exemplary embodiment in a cross section corresponding to that shown in FIG. 3.

FIG. 7 illustrates a further exemplary embodiment, in which the trenches are of V-shaped design. The details which correspond to the design shown in FIG. 3 are provided with the same reference numerals in this figure. A further advantageous configuration provides for a V-shaped inclination of the trench walls to be present only in the lower region of the trenches, while the trench walls which are lateral with respect to the source and drain regions run substantially in steeply vertical form. As a result it is possible, by means of anisotropic vertical etching of the ONO layer sequence, to remove everything apart from sections which remain in the upper region of the trench walls, i.e. just between the gate electrodes which are to be fabricated and the source/drain regions. Improved insulation of the gate electrode from the semiconductor material in the lower region of the trenches can be achieved if, in that area, after the removal of the memory layer, the lower boundary layer (bottom oxide) is oxidized to a greater thickness.

Figure 8:
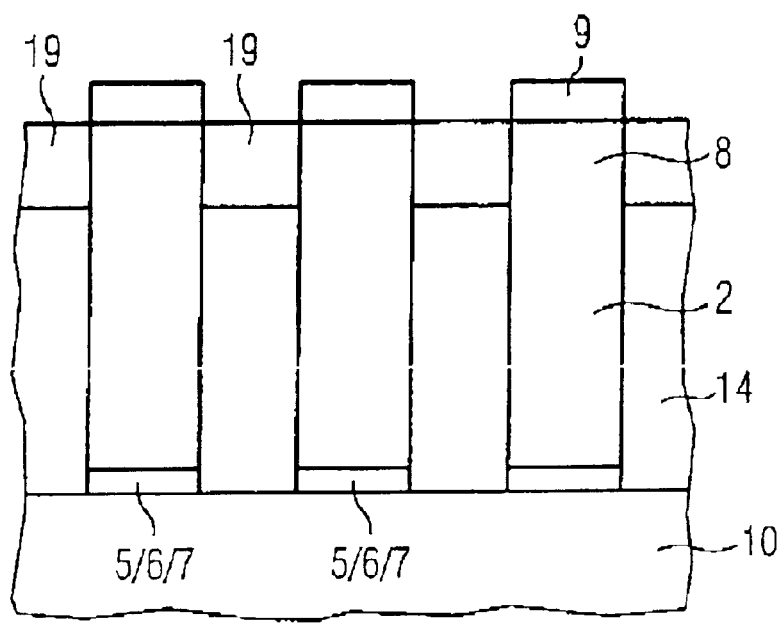
FIGS. 8 and 9 show cross sections corresponding to FIGS. 5 and 3, respectively, for a further embodiment.
Figure 9:
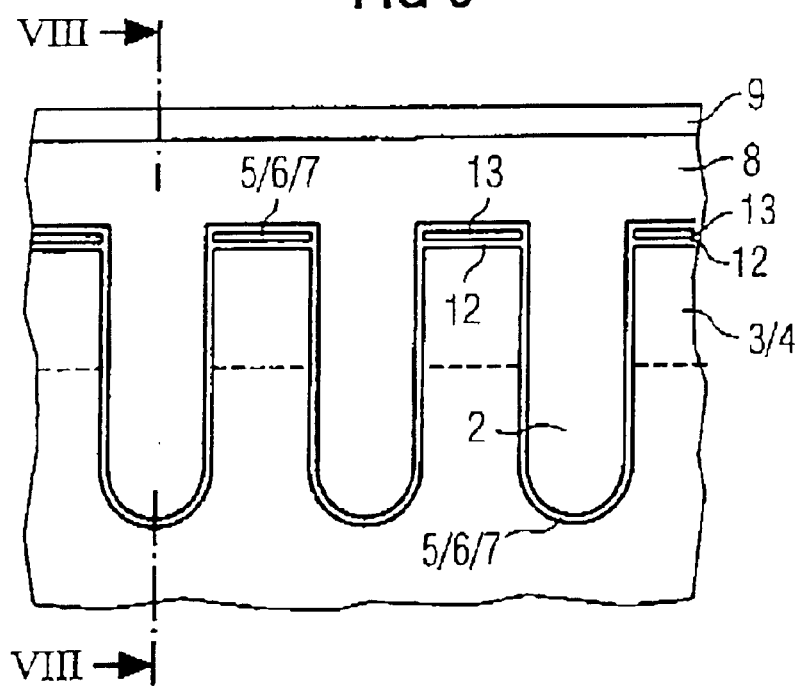

FIGS. 8 and 9 show a further embodiment in a cross section which runs transversely with respect to the word lines and a cross section which runs parallel to the word lines. In this design, the dielectric material of the trenches 14 which are provided for the gate electrodes is only removed in the regions which are provided for the word lines. The polysilicon which is provided for the word lines is only introduced into the exposed sections of the trenches 14. It is therefore possible to dispense with the need to refill the trenches 14 which are open between the word lines. To obtain a planar surface, before the trenches 14 filled with dielectric material (preferably oxide) are opened up, a layer 19 of dielectric material (preferably likewise oxide) is applied to the entire area of the surface. A mask in strip form, which covers the surface of the layer 19 which is present between the regions provided for the word lines, makes it possible to etch out the strip-like openings for the word lines, specifically deeply in the trenches 14, but only to a shallow depth in the layer 19 between the trenches 14. The layers of the ONO layer sequence 5/6/7 are deposited in these openings.

One advantage of this variant consists in the fact that, after the polysilicon for the gate electrodes 2 and the conductor tracks 8 provided for the word lines has been deposited, the trenches 14 are completely filled. It is therefore possible for the layer 9 which reduces the supply resistance to be fabricated as part of a siliciding process (salicide) used for the components of the drive circuit, from cobalt silicide or titanium silicide, as a result of this layer 9 initially being applied in the form of cobalt, which is then silicided.

It can also be seen from FIG. 9, that the pad nitride 13 which was initially applied has been left in place between the trenches 14 provided for the gate electrodes, above the bit lines (in the section illustrated in FIG. 9, in each case one source region and one drain region of the bit lines can be seen). This is because the pad nitride 13, if it is not removed prior to the etching of the trenches 14, can also be used as a mask (etching stop) for etching out of the trenches 14. During the fabrication of the exemplary embodiment illustrated in FIGS. 8 and 9, this has the particular advantage that, when using masks in strip form to open up the regions provided for the word lines and the gate electrodes, those sections of the pad nitride 13 which are still present between the trenches 14 form an expedient etching stop layer, so that deep etching takes place between the bit lines, but the source/drain regions remain in place.

Figure 10:
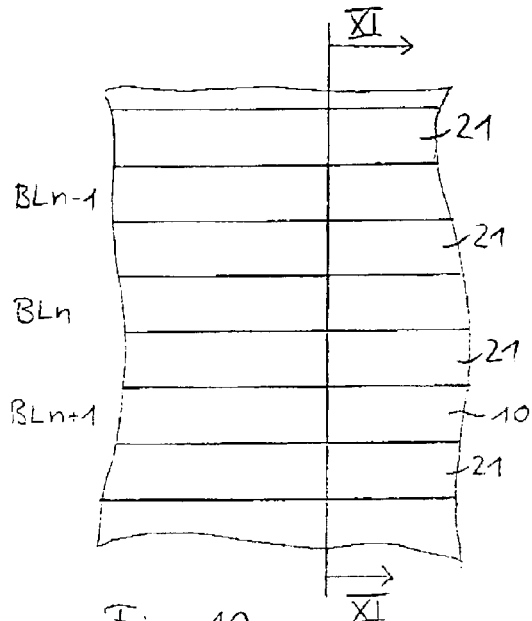
FIGS. 10, 12 and 13 show plan views

An alternative variant of the fabrication method described provides that, irrespective of the particular configuration of the actual storage medium, the word lines should only be applied and patterned after the gate electrodes have been introduced into the openings of the trenches. This is illustrated with reference to FIGS. 10 to 13. FIG. 10 illustrates the top side of the substrate or semiconductor body, for example of the p-well 10, with the intended orientation of the bit lines BLn−1, BLn, BLn+1. Preferably, first of all a pad oxide and a pad nitride are applied to this top side. A mask in strip form is used to etch trenches into the semiconductor material, and these trenches are filled with a dielectric 21, this preferably taking place with oxide in the manner of an STI.

Figure 11:
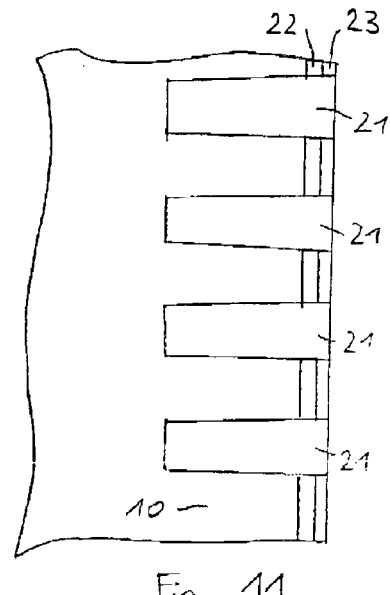
FIG. 11 shows a cross section, for explaining an alternate fabrication method.

FIG. 11 shows the cross section which is marked in FIG. 10, in which the pad oxide 22 and the pad nitride 23 can be seen as layers between the filled trenches. The top side is provided with a further mask in strip form, which is oriented transversely, preferably perpendicularly, to the orientation of the mask in strip form which was previously used. Openings are made in the dielectric 21 using this further mask.

Figure 12:
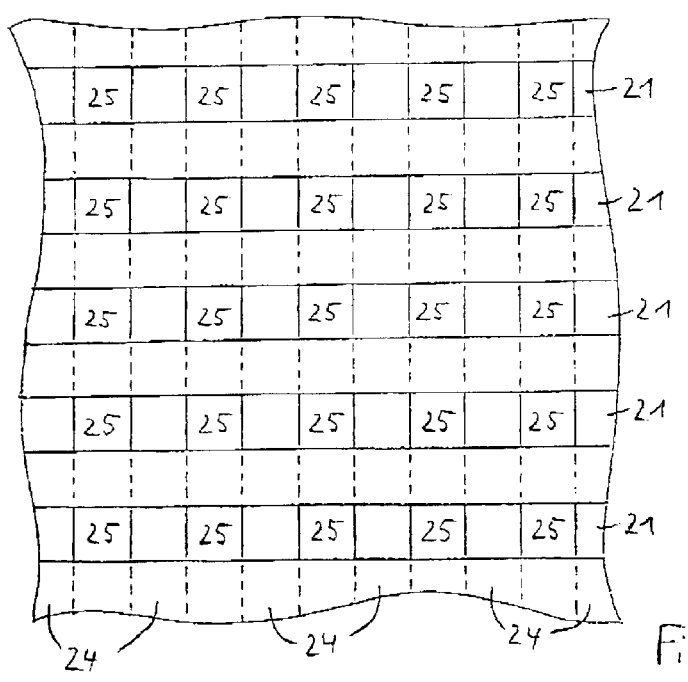

FIG. 12 shows the configuration which is achieved in this way. The strip-like sections 24 of the further mask, which in this case are illustrated separately with dashed edges, run perpendicular to the etched and filled trenches. In those regions of the top side which have been left exposed by the further mask, the dielectric 21 of the filled trenches is removed, so that openings 25 are formed at these locations. In these openings, the dielectric 21 is removed down to the base of the trenches.

The gate electrodes and the word lines which are arranged in self-aligned fashion with respect thereto can be introduced in a subsequent method step, as described above, using the layer 19 of dielectric material which has been patterned in strip form. However, it is also possible for the openings 25 initially to be provided with the gate dielectric on the relevant walls and to be filled with the material of the gate electrodes, and for the word lines only to be fabricated thereafter. In this fabrication variant, a layer of the material which is provided for the word lines (for example W, WSi, polysilicon) is deposited on the entire surface, i.e. including on the gate electrodes which have been introduced into the openings. If the same material is provided for the gate electrodes and the word lines, the openings 25 may also be filled at the same time as the deposition of this material over the entire surface of the top side. The gate electrodes of the transistors can also be advantageously structured with the third mask. The gate electrodes are located in a region of a control circuit bordering the memory field or in other logic regions of a circuit integrated on the same chip. A contacting of the word lines in the pitch of the array is therefore enabled in a simple manner, i.e. at the distance of neighboring lines to each other with the circuit components of the control circuits for controlling the memory transistors with the required voltages. Using a third mask in a strip form, the word lines are patterned from the layer which has been deposited over the entire surface. However, since the third mask in strip form is not necessarily fabricated to be precisely complementary to the mask that was previously used to form the openings 25, it may be the case that the word lines are slightly offset transversely to their longitudinal direction with respect to the gate electrodes, i.e. are not completely aligned with respect to the gate electrodes.

Figure 13:
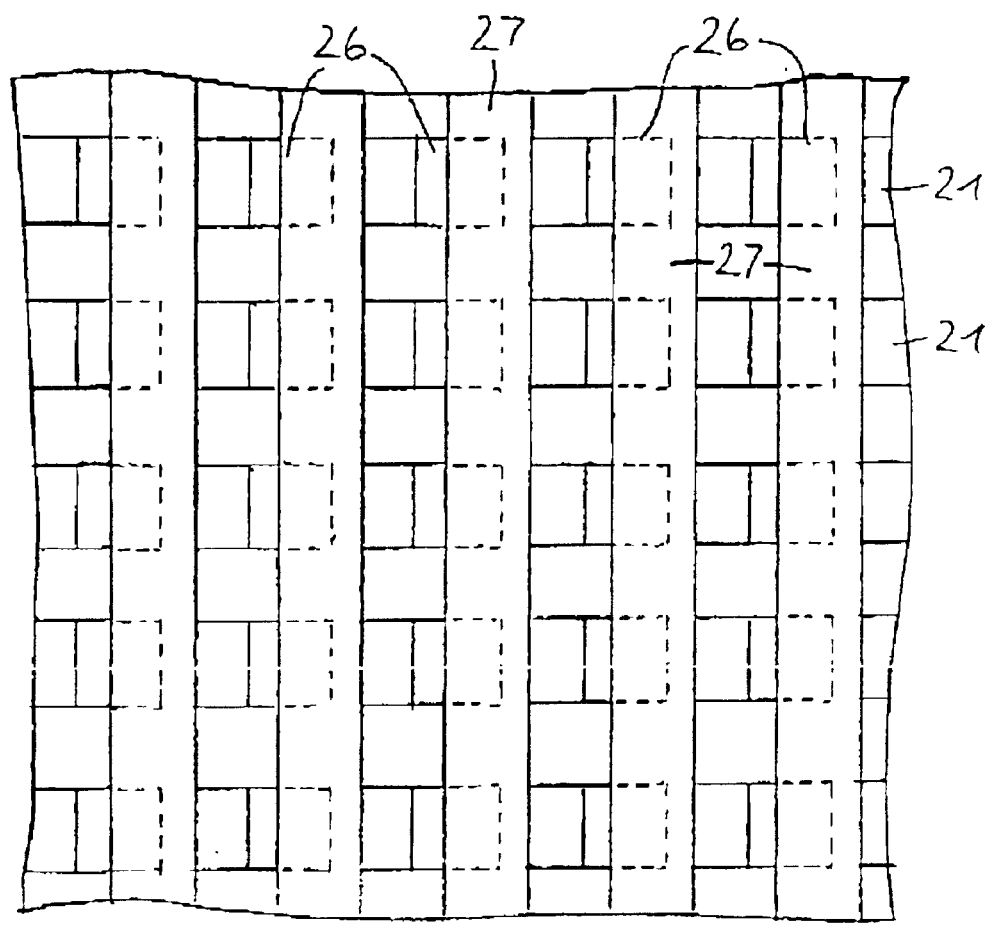

FIG. 13 also illustrates the top side of the configuration in a corresponding way to FIG. 12, after the openings 25 have been filled with the gate electrodes 26 and the word lines 27 have been patterned. In this case, the word lines are shown with exaggerated clarity, in such a way that they are laterally offset with respect to the gate electrodes 26. The word lines 27 therefore in each case only partially cover the gate electrodes 26, which are in this case approximately square when viewed from above, covering them specifically in the region which is illustrated with covered contours shown by dashed lines.

In a further variant of the fabrication method, first of all, only those trenches which are provided as STI trenches for insulation from the drive periphery which forms a ring around the memory cell configuration are etched and filled with dielectric material. The trenches for the gate electrodes are only etched into the semiconductor material during the fabrication of the doped regions for the bit lines and source and drain. However, the design described above has the advantage that the trenches are self-aligned with respect to the outer STI.

Following the patterning of the word lines, the customary process steps which are known per se in order to complete the drive components are carried out. These include in particular the implantations for the source and drain regions of the drive transistors, including the LDD and pocket implants, which take place independently of the memory cell structure. Interconnection is effected via a suitable number of patterned metallization levels which are arranged in intermetal dielectrics. The description of the fabrication of the memory cell configuration according to the invention also reveals its structure and in particular the structure of the individual memory cell.

We claim:

1. A memory cell comprising:
   a semiconductor component having semiconductor material and a top side, said semiconductor component selected from the group consisting of a semiconductor body and a semiconductor layer, said semiconductor material having an upper surface;
   said semiconductor material having a trench formed therein and a gate electrode located in said trench;
   a memory transistor including a source region and a drain region formed at said upper surface of said semiconductor material, said memory transistor including said gate electrode located on said top side and located in a lateral direction between said source region and said drain region, said source region and said drain region being located on opposite sides of said trench;
   a dielectric material separating said gate electrode from said semiconductor material;
   a layer sequence including boundary layers and a memory layer located between said boundary layers, said layer sequence located at least between said source region and said gate electrode and at least between said drain region and said gate electrode; and
   a barrier level of at least 2 eV being present between said semiconductor material and said memory layer.

2. The memory cell according to claim 1, wherein one of said boundary layers faces said semiconductor material and at least said boundary layer that faces said semiconductor material is made of a material with a relative dielectric constant of at least 3.9.

3. The memory cell according to claim 1, wherein one of said boundary layers faces said semiconductor material and at least said boundary layer that faces said semiconductor material is made of a material with a relative dielectric constant of at least 7.8.

4. The memory cell according to claim 1, wherein one of said boundary layers faces said semiconductor material and at least said boundary layer that faces said semiconductor material is made of a material with a relative dielectric constant of at least 20.

5. The memory cell according to claim 1, wherein at least one of said boundary layers includes a material that is selected from the group consisting of an oxide and a silicate.

6. The memory cell according to claim 1, wherein at least one of said boundary layers includes a material that is selected from the group consisting of a nitride and an oxynitride.

7. The memory cell according to claim 1, wherein at least one of said boundary layers includes a material that is selected from the group consisting of $Al_2O_3$ and $Ta_2O_5$.

8. The memory cell according to claim 1, wherein said memory layer is a material that is selected from the group consisting of undoped silicon, tantalum oxide, tantalate, hafnium silicate, hafnium oxide, titanium oxide, titanate, zirconium oxide, lanthanum oxide and aluminum oxide.

9. The memory cell according to claim 1, wherein said memory layer is a material that is selected from the group consisting of tantalum oxide and tantalate.

10. A memory cell comprising:
    a semiconductor component having semiconductor material and a top side, said semiconductor component selected from the group consisting of a semiconductor body and a semiconductor layer, said semiconductor material having an upper surface;
    said semiconductor material having a trench formed therein and a gate electrode located in said trench;
    a memory transistor including a source region and a drain region formed at said upper surface of said semiconductor material, said memory transistor including said gate electrode located on said top side and located in a lateral direction between said source region and said drain region, said source region and said drain region being located on opposite sides of said trench;
    a dielectric material separating said gate electrode from said semiconductor material; and
    a layer sequence including boundary layers and a memory layer located between said boundary layers, said layer sequence located at least between said source region and said gate electrode and at least between said drain region and said gate electrode, said memory layer being a material selected from the group consisting of hafnium silicate and hafnium oxide.

11. A memory cell comprising:
a semiconductor component having semiconductor material and a top side, said semiconductor component selected from the group consisting of a semiconductor body and a semiconductor layer, said semiconductor material having an upper surface;
said semiconductor material having a trench formed therein and a gate electrode located in said trench;
a memory transistor including a source region and a drain region formed at said upper surface of said semiconductor material, said memory transistor including said gate electrode located on said top side and located in a lateral direction between said source region and said drain region, said source region and said drain region being located on opposite sides of said trench;
a dielectric material separating said gate electrode from said semiconductor material; and
a layer sequence including boundary layers and a memory layer located between said boundary layers, said layer sequence located at least between said source region and said gate electrode and at least between said drain region and said gate electrode; said memory layer being a material selected from the group consisting of titanium oxide and titanate.

12. A memory cell comprising:
a semiconductor component having semiconductor material and a top side, said semiconductor component selected from the group consisting of a semiconductor body and a semiconductor layer, said semiconductor material having an upper surface;
said semiconductor material having a trench formed therein and a gate electrode located in said trench;
a memory transistor including a source region and a drain region formed at said upper surface of said semiconductor material, said memory transistor including said gate electrode located on said top side and located in a lateral direction between said source region and said drain region, said source region and said drain region being located on opposite sides of said trench;
a dielectric material separating said gate electrode from said semiconductor material; and
a layer sequence including boundary layers and a memory layer located between said boundary layers, said layer sequence located at least between said source region and said gate electrode and at least between said drain region and said gate electrode; said memory layer being a material selected from the group consisting of zirconium oxide, lanthanum oxide, and aluminum oxide.

13. A memory cell configuration, comprising:
a semiconductor component having semiconductor material and a top side, said semiconductor component selected from the group consisting of a semiconductor body and a semiconductor layer, said semiconductor material having an upper surface;
said semiconductor material having a plurality of trenches formed therein;
said plurality of said trenches defining walls;
a plurality of memory cells that each include:
a memory transistor including a source region and a drain region formed at said upper surface of said semiconductor material, said memory transistor including a gate electrode located on said top side and located in a lateral direction between said source region and said drain region, said source region and said drain region being located on opposite sides of each one of said plurality of trenches;
a dielectric material separating said gate electrode from said semiconductor material; and
a layer sequence including boundary layers and a memory layer located between said boundary layers, said layer sequence located at least between said source region and said gate electrode and at least between said drain region and said gate electrode, said memory layer being interrupted between a structure selected from the group consisting of said walls of one of said trenches and adjacent ones of said trenches; and
a plurality of conductor tracks defining word lines, said gate electrode of each one of said plurality of said memory cells electrically conductively connected to one of said plurality of said conductor tracks;
said source region of one of said plurality of said memory cells defining said drain region of an adjacent one of said plurality of said memory cells and said drain region of said one of said plurality of said memory cells defining said source region of another adjacent one of said plurality of said memory cells; and
said gate electrode of each one of said plurality of said memory cells being located in a respective one of said plurality of said trenches.

14. The configuration according to claim 13, wherein:
said top side of said semiconductor material defines a top surface; and
said layer sequence is applied completely over said top surface of said semiconductor material that is between said semiconductor material and said gate electrode of each one of said plurality of said memory cells and that is between said semiconductor material and said plurality of said conductor tracks.

15. The configuration according to claim 13, wherein:
each one of said plurality of said trenches is shaped in a manner selected from the group consisting of being V-shaped and shaped with obliquely oriented walls formed in said semiconductor material.

16. A memory cell configuration, comprising:
a semiconductor component having semiconductor material and a top side, said semiconductor component selected from the group consisting of a semiconductor body and a semiconductor layer, said semiconductor material having an upper surface;
said semiconductor material having a plurality of trenches formed therein;
a plurality of memory cells that each include:
a memory transistor including a source region and a drain region formed at said upper surface of said semiconductor material, said memory transistor including a gate electrode located on said top side and located in a lateral direction between said source region and said drain region, said source region and said drain region being located on opposite sides of each one of said plurality of trenches;
a dielectric material separating said gate electrode from said semiconductor material; and
a layer sequence including boundary layers and a memory layer located between said boundary layers, said layer sequence located at least between said source region and said gate electrode and at least between said drain region and said gate electrode; and a plurality of conductor tracks defining word lines, said gate electrode of each one of said plurality of said memory cells electrically conductively connected to one of said plurality of said conductor tracks;

said source region of one of said plurality of said memory cells defining said drain region of an adjacent one of said plurality of said memory cells and said drain region of said one of said plurality of said memory cells defining said source region of another adjacent one of said plurality of said memory cells, said source region and said drain region of one of said plurality of said memory cells being spaced at most 180 nm apart; and said gate electrode of each one of said plurality of said memory cells being located in a respective one of said plurality of said trenches.

17. A memory cell configuration, comprising:

a semiconductor component having semiconductor material and a top side, said semiconductor component selected from the group consisting of a semiconductor body and a semiconductor layer, said semiconductor material having an upper surface;

said semiconductor material having a plurality of trenches formed therein;

a plurality of memory cells that each include:
  a memory transistor including a source region and a drain region formed at said upper surface of said semiconductor material, said memory transistor including a gate electrode located on said top side and located in a lateral direction between said source region and said drain region, said source region and said drain region being located on opposite sides of each one of said plurality of trenches;
  a dielectric material separating said gate electrode from said semiconductor material; and
  a layer sequence including boundary layers and a memory layer located between said boundary layers, said layer sequence located at least between said source region and said gate electrode and at least between said drain region and said gate electrode; and a plurality of conductor tracks defining word lines, said gate electrode of each one of said plurality of said memory cells electrically conductively connected to one of said plurality of said conductor tracks;

said source region of one of said plurality of said memory cells defining said drain region of an adjacent one of said plurality of said memory cells and said drain region of said one of said plurality of said memory cells defining said source region of another adjacent one of said plurality of said memory cells, said source region and said drain region of one of said plurality of said memory cells being spaced at most 150 nm apart; and said gate electrode of each one of said plurality of said memory cells being located in a respective one of said plurality of said trenches.

* * * * *